United States Patent
Nishio et al.

(10) Patent No.: US 11,563,090 B2
(45) Date of Patent: Jan. 24, 2023

(54) SEMICONDUCTOR DEVICE

(71) Applicant: KABUSHIKI KAISHA TOSHIBA, Tokyo (JP)

(72) Inventors: Johji Nishio, Machida (JP); Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/014,032

(22) Filed: Sep. 8, 2020

(65) Prior Publication Data
US 2021/0118999 A1 Apr. 22, 2021

(30) Foreign Application Priority Data
Oct. 16, 2019 (JP) .............................. JP2019-189278

(51) Int. Cl.
*H01L 29/16* (2006.01)
*H01L 29/66* (2006.01)
(Continued)

(52) U.S. Cl.
CPC ........ *H01L 29/1608* (2013.01); *H01L 29/045* (2013.01); *H01L 29/0634* (2013.01);
(Continued)

(58) Field of Classification Search
CPC ............. H01L 29/0619; H01L 29/7395; H01L 29/0634; H01L 29/872; H01L 29/66068; H01L 29/045; H01L 29/1608
See application file for complete search history.

(56) References Cited

U.S. PATENT DOCUMENTS 7,462,909 B2   12/2008   Saito et al.
7,646,026 B2   1/2010   Friedrichs et al.
(Continued)

FOREIGN PATENT DOCUMENTS

JP   2007-36213 A   2/2007
JP   4857697 B2   1/2012
(Continued)

OTHER PUBLICATIONS

Wikipedia page on silicon carbide (Year: 2022).*
(Continued)

*Primary Examiner* — Bilkis Jahan
*Assistant Examiner* — Victor V Barzykin
(74) *Attorney, Agent, or Firm* — Oblon, McClelland, Maier & Neustadt, L.L.P.

(57) ABSTRACT

According to an embodiment of the invention, a semiconductor device includes a base body that includes silicon carbide, a first semiconductor member that includes silicon carbide and is of a first conductivity type, and a second semiconductor member that includes silicon carbide and is of a second conductivity type. A first direction from the base body toward the first semiconductor member is along a [0001] direction of the base body. The second semiconductor member includes a first region, a second region, and a third region. The first semiconductor member includes a fourth region. A second direction from the first region toward the second region is along a [1-100] direction of the base body. The fourth region is between the first region and the second region in the second direction. A third direction from the fourth region toward the third region is along a [11-20] direction of the base body.

19 Claims, 8 Drawing Sheets

(51) Int. Cl.
*H01L 29/78* (2006.01)
*H01L 29/04* (2006.01)
*H01L 29/872* (2006.01)
*H01L 29/06* (2006.01)
*H01L 29/739* (2006.01)

(52) U.S. Cl.
CPC .... *H01L 29/66068* (2013.01); *H01L 29/7802* (2013.01); *H01L 29/872* (2013.01); *H01L 29/0619* (2013.01); *H01L 29/7395* (2013.01)

(56) References Cited

U.S. PATENT DOCUMENTS

| | | | | |
|---|---|---|---|---|
| 2008/0173935 | A1* | 7/2008 | Miyajima | H01L 29/7811 257/328 |
| 2012/0228634 | A1* | 9/2012 | Sugi | H01L 29/7803 257/77 |
| 2013/0207124 | A1* | 8/2013 | Hayashi | H01L 29/7802 257/77 |
| 2013/0210208 | A1* | 8/2013 | Hayashi | H01L 29/7813 438/285 |
| 2013/0285069 | A1* | 10/2013 | Yano | H01L 29/1608 257/77 |
| 2014/0209927 | A1 | 7/2014 | Nishio et al. | |
| 2014/0264477 | A1* | 9/2014 | Bhalla | H01L 29/0619 257/263 |
| 2015/0076519 | A1* | 3/2015 | Iwamuro | H01L 21/046 257/77 |
| 2015/0357415 | A1* | 12/2015 | Kagawa | H01L 29/0623 257/77 |
| 2016/0155836 | A1* | 6/2016 | Iwamuro | H01L 29/66068 257/77 |
| 2016/0268381 | A1* | 9/2016 | Ota | H01L 29/34 |
| 2017/0076947 | A1* | 3/2017 | Uehara | H01L 29/7802 |
| 2017/0345891 | A1* | 11/2017 | Van Brunt | H01L 29/1608 |
| 2019/0244812 | A1 | 8/2019 | Nishio et al. | |
| 2020/0251560 | A1 | 8/2020 | Nishio et al. | |

FOREIGN PATENT DOCUMENTS

| | | |
|---|---|---|
| JP | 2013-232574 A | 11/2013 |
| JP | 2014-146748 A | 8/2014 |
| JP | 2015-2277 A | 1/2015 |
| JP | 2017-168720 A | 9/2017 |
| JP | 6244826 B2 | 12/2017 |
| JP | 2019-140186 A | 8/2019 |
| JP | 2020-126919 A | 8/2020 |

OTHER PUBLICATIONS

Tawara, T. et al., "Short minority carrier lifetimes in highly nitrogen-doped 4H—SiC epilayers for suppression of the stacking fault formation in PiN diodes," Journal of Applied Physics, vol. 120, No. 115101, 2016, 8 pages.

* cited by examiner

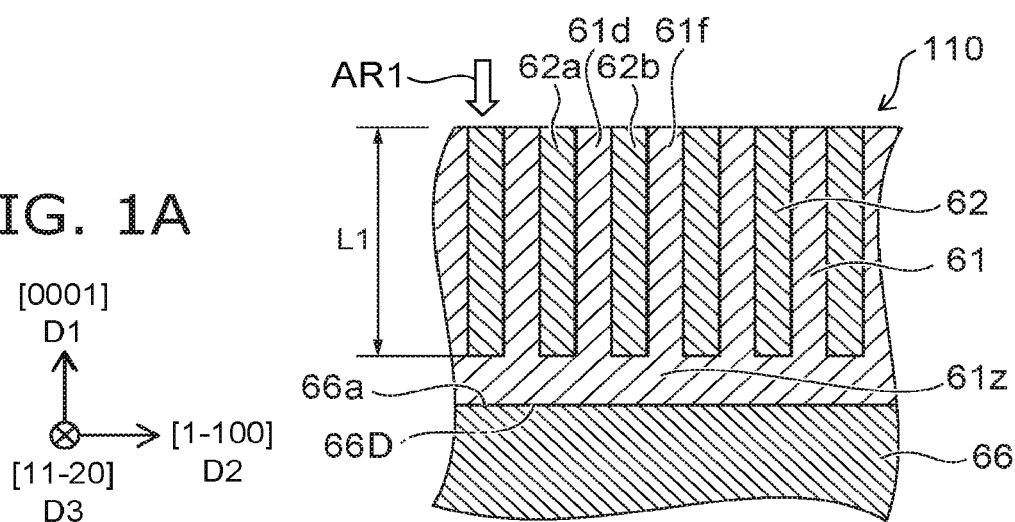
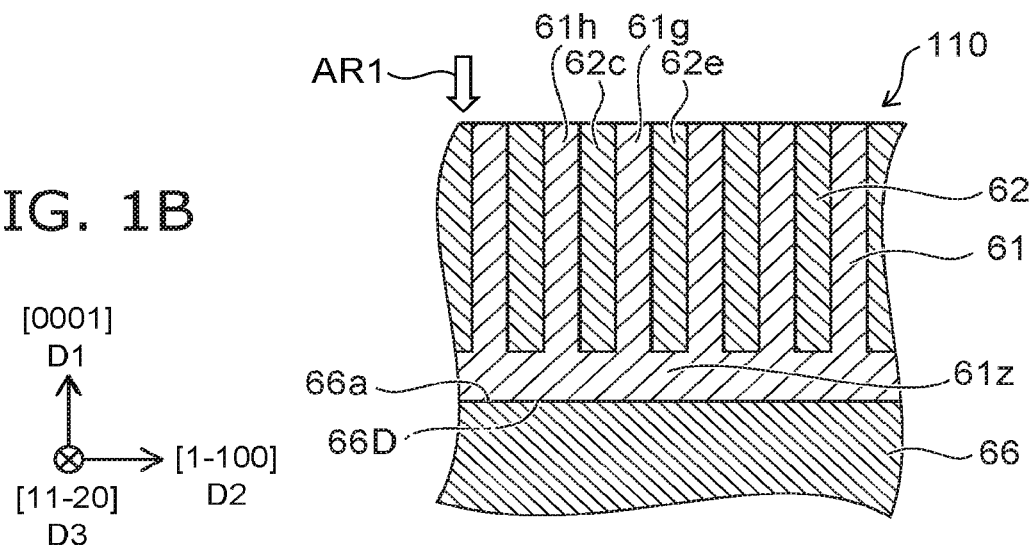
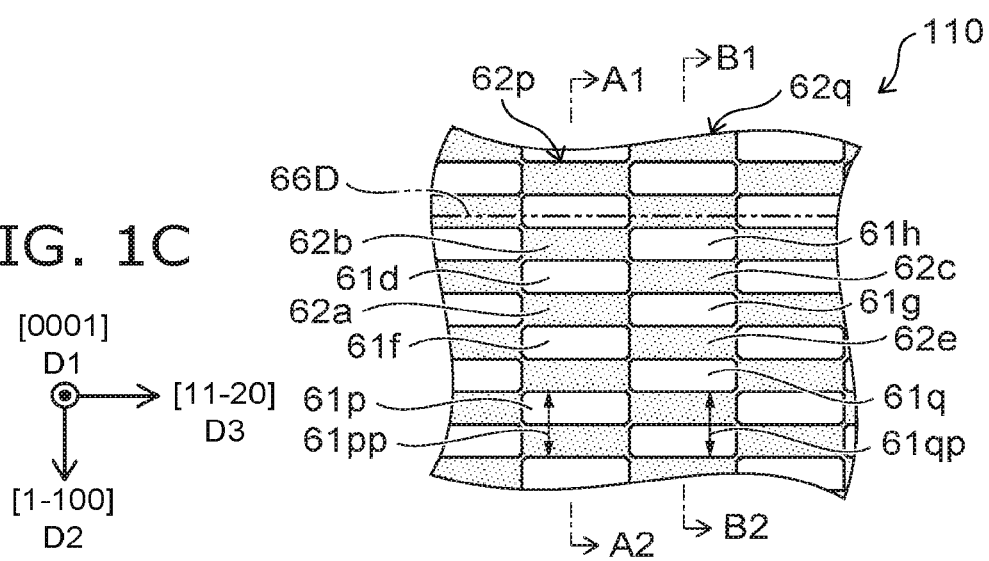

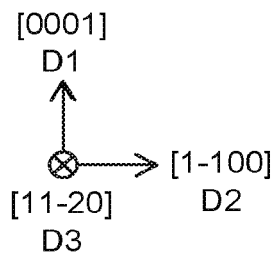
FIG. 2A
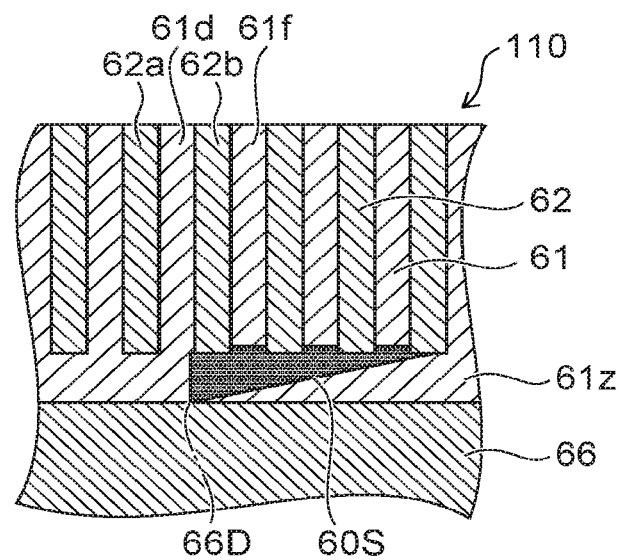
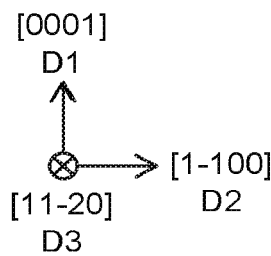
FIG. 2B
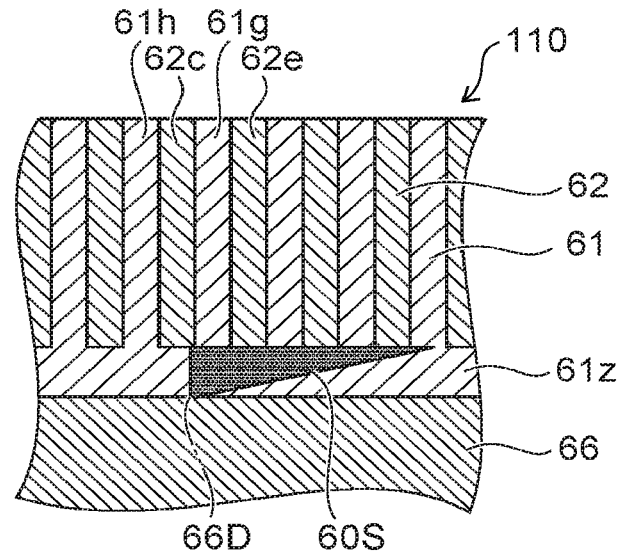
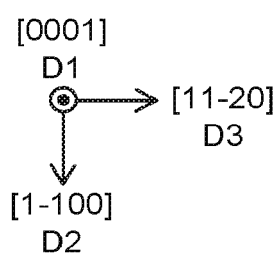
FIG. 2C
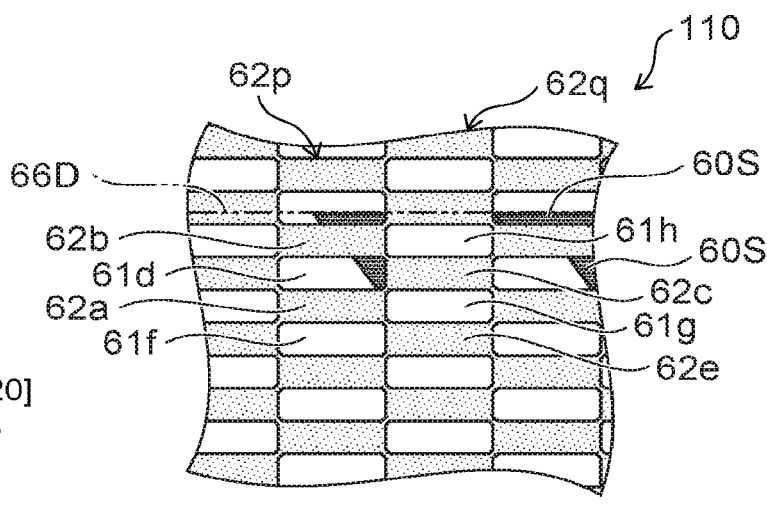

SEMICONDUCTOR DEVICE

CROSS-REFERENCE TO RELATED APPLICATIONS

This application is based upon and claims the benefit of priority from Japanese Patent Application No. 2019-189278, filed on Oct. 16, 2019; the entire contents of which are incorporated herein by reference.

FIELD

Embodiments of the invention generally relate to a semiconductor device.

BACKGROUND

For example, there is a semiconductor device that includes silicon carbide (SiC). Stable characteristics of the semiconductor device are desirable.

BRIEF DESCRIPTION OF THE DRAWINGS

FIGS. 1A to 1C are schematic views illustrating a semiconductor device according to a first embodiment;

FIGS. 2A to 2C are schematic views illustrating the semiconductor device according to the first embodiment;

DETAILED DESCRIPTION

Figure 3A:
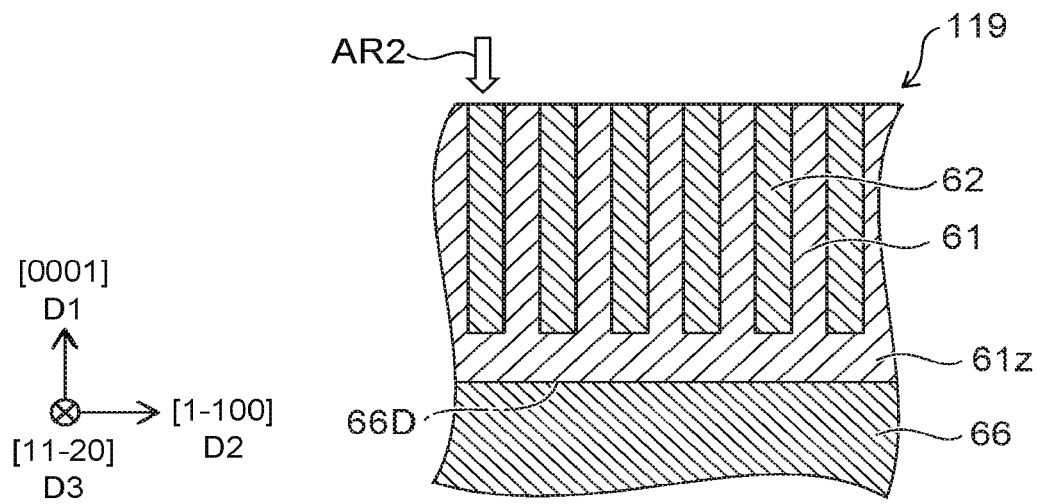
FIGS. 3A and 3B are schematic views illustrating a semiconductor device of a first reference example.

According to an embodiment of the invention, a semiconductor device includes a base body that includes silicon carbide, a first semiconductor member that includes silicon carbide and is of a first conductivity type, and a second semiconductor member that includes silicon carbide and is of a second conductivity type. A first direction from the base body toward the first semiconductor member is along a [0001] direction of the base body. The second semiconductor member includes a first region, a second region, and a third region. The first semiconductor member includes a fourth region. A second direction from the first region toward the second region is along a [1-100] direction of the base body. The fourth region is between the first region and the second region in the second direction. A third direction from the fourth region toward the third region is along a [11-20] direction of the base body.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIGS. 1A to 1C are schematic views illustrating a semiconductor device according to a first embodiment. FIG. 1A is a line A1-A2 cross-sectional view of FIG. 1C. FIG. 1B is a line B1-B2 cross-sectional view of FIG. 1C. FIG. 1C is a see-through plan view as viewed along arrow AR1 of FIGS. 1A and 1B.

As shown in FIGS. 1A to 1C, the semiconductor device 110 according to the embodiment includes a base body 66, a first semiconductor member 61, and a second semiconductor member 62. The base body 66 includes silicon carbide. The base body 66 is, for example, a SiC substrate (e.g., a SiC bulk substrate).

The first semiconductor member 61 includes silicon carbide. The first semiconductor member 61 is of a first conductivity type. The second semiconductor member 62 includes silicon carbide. The second semiconductor member 62 is of a second conductivity type. The first semiconductor member 61 includes, for example, n-type SiC. The second semiconductor member 62 includes, for example, p-type SiC. The SiC that is included in the first semiconductor member 61 includes, for example, at least one selected from the group consisting of N, P, and As. The SiC that is included in the second semiconductor member 62 includes, for example, at least one selected from the group consisting of B, Al, and Ga.

A first direction D1 from the base body 66 toward the first semiconductor member 61 is along the [0001] direction of the base body 66.

As shown in FIGS. 1A and 1B, the base body 66 includes a surface 66a. The surface 66a faces the first semiconductor member 61. The surface 66a is, for example, the upper surface of the base body 66. As described below, the surface 66a may be oblique to the [0001] direction of the base body 66. For example, the surface 66a may be oblique to the (0001) plane of the base body 66.

In the example as shown in FIGS. 1A to 1C, the second semiconductor member 62 includes a first region 62a, a second region 62b, and a third region 62c. The first semiconductor member 61 includes a fourth region 61d. A second direction D2 from the first region 62a toward the second region 62b is along the [1-100] direction of the base body 66. The fourth region 61d is between the first region 62a and the second region 62b in the second direction D2. A third direction D3 from the fourth region 61d toward the third region 62c is along the [11-20] direction of the base body 66.

The notations of the "[0001] direction", the "[1-100] direction", and the "[11-20] direction" described above are based on the Miller indexes. The "-" notation denotes a "bar" over the subsequent numeral.

For example, as shown in FIG. 1C, the second semiconductor member 62 includes multiple first-group regions 62p and multiple second-group regions 62q. The multiple first-group regions 62p are arranged along the second direction D2. The multiple second-group regions 62q are arranged along the second direction D2. A pitch 62pp along the second direction D2 of the multiple first-group regions 62p is equal to a pitch 62qp along the second direction D2 of the multiple second-group regions 62q. The multiple first-group regions 62p and the multiple second-group regions 62q have a half-pitch shift in the second direction D2.

The first semiconductor member 61 includes a first partial region 61p and a second partial region 61q. The first partial region 61p is between the multiple first-group regions 62p in the second direction D2. The second partial region 61q is between the multiple second-group regions 62q in the second direction D2. The direction from the first partial region 61p toward one of the multiple second-group regions 62q is along the third direction D3. The direction from one of the multiple first-group regions 62p toward the second partial region 61q is along the third direction D3.

Thus, multiple regions that are included in the first semiconductor member 61 and multiple regions that are included in the second semiconductor member 62 are alternately provided in the second and third directions D2 and D3 in the D2-D3 plane. The multiple regions that are included in the first semiconductor member 61 and the multiple regions that are included in the second semiconductor member 62 are provided in a "checkered configuration".

The multiple first-group regions 62p and the multiple second-group regions 62q are, for example, p-type pillars extending along the first direction D1. The first partial region 61p and the second partial region 61q are, for example, n-type pillars extending along the first direction D1.

For example, the second semiconductor member 62 includes a fifth region 62e. The first semiconductor member 61 includes a sixth region 61f, a seventh region 61g, and an eighth region 61h. The fourth region 61d is between the sixth region 61f and the second region 62b in the second direction D2. The first region 62a is between the sixth region 61f and the fourth region 61d in the second direction D2. The direction from the sixth region 61f toward the fifth region 62e is along the third direction D3. The third region 62c is between the fifth region 62e and the eighth region 61h in the second direction D2. The seventh region 61g is between the fifth region 62e and the third region 62c in the second direction D2. The direction from the first region 62a toward the seventh region 61g is along the third direction D3. The direction from the second region 62b toward the eighth region 61h is along the third direction D3. The first region 62a, the second region 62b, the third region 62c, and the fifth region 62e are, for example, p-type pillars. The fourth region 61d, the sixth region 61f, the seventh region 61g, and the eighth region 61h are, for example, n-type pillars.

In the example as shown in FIGS. 1A and 1B, the first semiconductor member 61 includes a first portion 61z. The first portion 61z is provided between the base body 66 and the first region 62a, between the base body 66 and the second region 62b, and between the base body 66 and the third region 62c.

For example, the first semiconductor member 61 and the second semiconductor member 62 correspond to drift regions. The semiconductor device 110 is, for example, a SiC power semiconductor device having a Si (super junction) structure.

As shown in FIGS. 1A to 1C, there are cases where the base body 66 (e.g., the SiC substrate) includes a basal plane dislocation 66D (BPD). When a current flows in the drift layer when operating the semiconductor device, there is a possibility that a stacking fault may expand in the drift layer from the basal plane dislocation 66D as a starting point. Forward-direction characteristic degradation (Vf degradation) occurs due to the stacking fault.

In the embodiment, the expansion of the stacking fault can be suppressed by the second semiconductor member 62 that includes the multiple regions. According to the embodiment, a semiconductor device can be provided in which stable characteristics are obtained.

FIGS. 1A to 1C illustrate an initial state before the current flows in the drift layer. An example of the semiconductor device 110 after the current flows in the drift layer will now be described.

FIGS. 2A to 2C are schematic views illustrating the semiconductor device according to the first embodiment. FIGS. 2A to 2C illustrate states after the current flows in FIGS. 1A to 1C.

After the current flows as shown in FIGS. 2A and 2B, a stacking fault 60S expands from the basal plane dislocation 66D as a starting point. The stacking fault 60S is, for example, a 1SSF (Shockley-Type Stacking Fault). The stacking fault 60S propagates along the [11-20] direction.

The stacking fault 60S no longer expands when the stacking fault 60S reaches the bottom portion of a p-type pillar. In the embodiment, multiple p-type pillars are provided in a checkered configuration along the second and third directions D2 and D3. Thereby, if the expansion of the stacking fault 60S does not stop at the bottom portion of one p-type pillar, the expansion will stop at the bottom portion of the next p-type pillar.

For example, the stacking fault 60S expands through the first portion 61z of the first semiconductor member 61 from the basal plane dislocation 66D as a starting point. The expansion of the stacking fault 60S stops at the bottom portion of the p-type pillars. Therefore, the expansion of the stacking fault 60S into portions higher than the first portion 61z can be suppressed.

FIGS. 3A, 3B, 4A, and 4B are schematic views illustrating a semiconductor device of a first reference example.

Figure 3B:
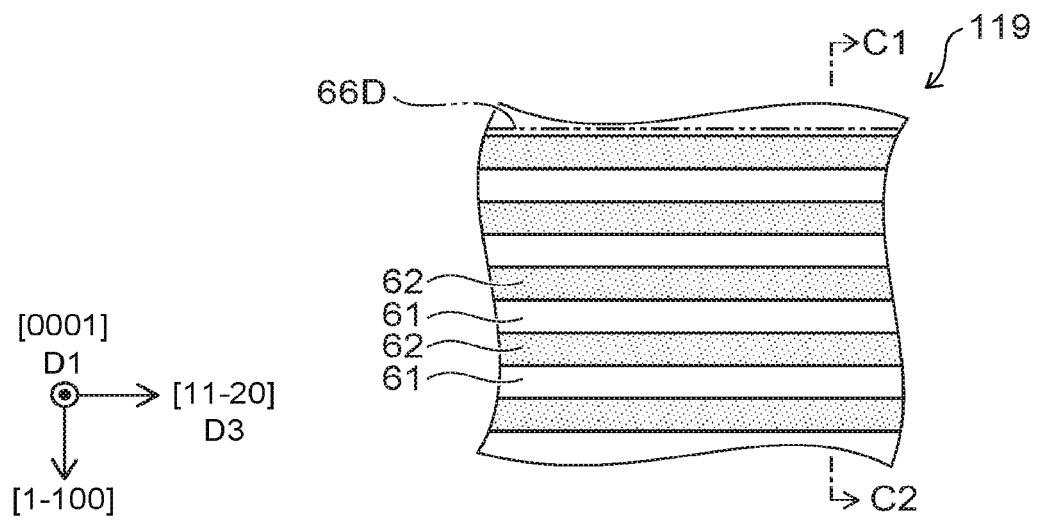
Figure 4A:
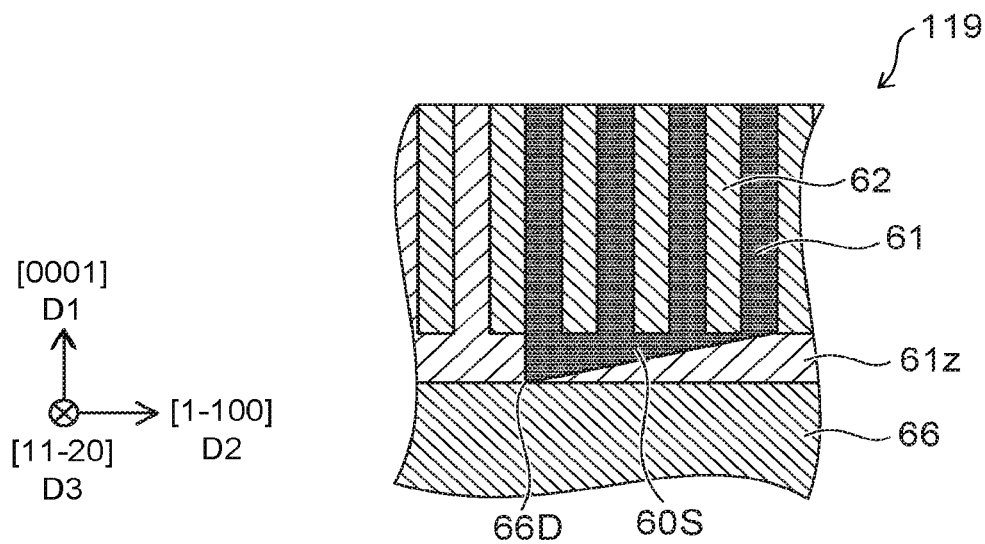
FIGS. 4A and 4B are schematic views illustrating a semiconductor device of a first reference example.
Figure 4B:
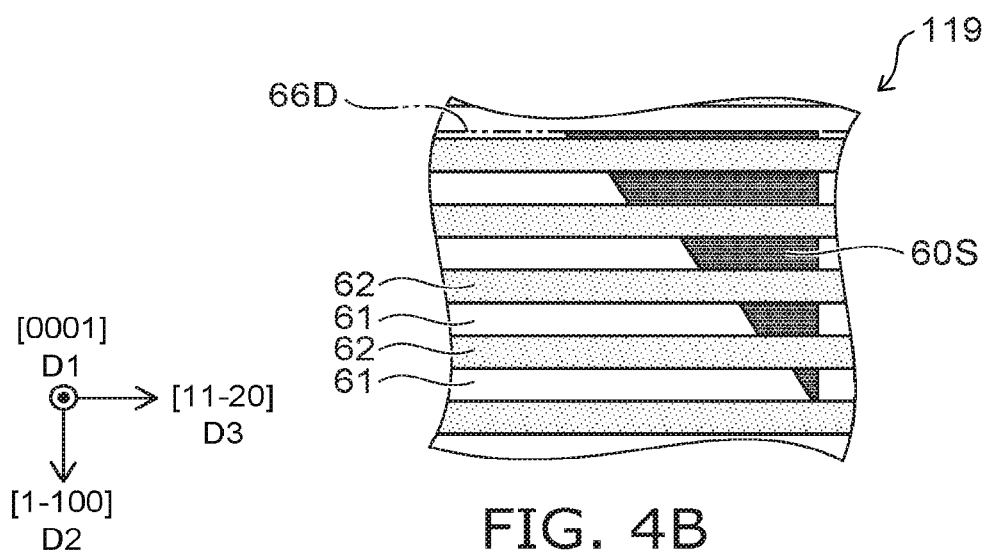

FIG. 3A is a line C1-C2 cross-sectional view of FIG. 3B. FIG. 3B is a see-through plan view as viewed along arrow AR2 of FIG. 3A. FIGS. 4A and 4B correspond respectively to FIGS. 3A and 3B. FIGS. 3A and 3B correspond to an initial state before the current flows. FIGS. 4A and 4B correspond to states after the current flows.

In the semiconductor device 119 of the first reference example as shown in FIGS. 3A and 3B, the n-type first semiconductor member 61 includes multiple band-shaped regions extending in the [11-20] direction. The p-type second semiconductor member 62 also includes multiple band-shaped regions extending in the [11-20] direction. These band-shaped regions are alternately arranged along the [1-100] direction.

In the semiconductor device 119 as shown in FIGS. 4A and 4B, the stacking fault 60S expands along the [11-20] direction from the basal plane dislocation 66D as a starting point when the current flows. Therefore, the stacking fault 60S does not remain inside the first portion 61z and extends also into the upper portion of the p-type second semiconductor member 62.

In the semiconductor device 119, the stacking fault 60S also reaches the upper portion of the drift layer; for example, forward-direction characteristic degradation (Vf degradation) easily occurs due to hole injection.

Conversely, in the embodiment, the stacking fault 60S is formed in the first portion 61z under the p-type pillars, but the expansion of the stacking fault 60S upward from there is suppressed.

On the other hand, a second reference example may be considered in which the n-type first semiconductor member 61 and the p-type second semiconductor member 62 include multiple band-shaped regions extending in the [1-100] direction. In such a case, although it is considered that the expansion of the stacking fault 60S is suppressed, for example, it is difficult to obtain high electrical characteristics because the channel is along the m-plane.

In the embodiment, the multiple p-type pillars are provided in a checkered configuration. Thereby, if the stacking fault 60S does not stop at one p-type pillar, the stacking fault 60S will stop at the next p-type pillar. In the embodiment, the stacking fault 60S can be effectively prevented from reaching the upper portions of the p-type pillars.

In the embodiment, for example, the stacking fault 60S can be suppressed to a size such that the Vf degradation is substantially not affected. In the embodiment, the Vf degradation can be practically suppressed. For example, the increase of the resistance of the forward direction can be suppressed.

For example, when the stacking fault 60S expands, the expansion of the stacking fault 60S stops at the bottom portion of the p-type pillar most proximate in the [−1-120] direction when viewed from the stacking fault 60S. If the expansion is not stopped and the stacking fault 60S expands into the n-type pillar portion, the expansion stops at the bottom portion (the (11-20) plane) of the p-type pillar second-most proximate in the [−1-120] direction when viewed from the stacking fault 60S. Thereby, the stacking fault 60S can be prevented from reaching the upper portion of the SiC epitaxial layer of the semiconductor device. In the embodiment, the Vf degradation can be suppressed to be small even when the stacking fault 60S occurs. For example, the degradation of the breakdown voltage can be suppressed.

As shown in FIGS. 2A and 2B, the first portion 61z of the first semiconductor member 61 includes the stacking fault 60S connected to the basal plane dislocation 66D of the base body 66. At least a portion of the stacking fault 60S contacts the second semiconductor member 62. For example, the expansion of the stacking fault 60S stops at at least one of the multiple regions included in the second semiconductor member 62 (e.g., at least one of the first region 62a, the second region 62b, or the third region 62c).

In the embodiment, for example, the end portion of the fourth region 61d at the [11-20] direction side of the base body 66 contacts the end portion of the third region 62c at the [−1-120] direction side of the base body 66.

In the embodiment as shown in FIG. 1C, for example, one of the multiple regions included in the first semiconductor member 61 contacts the second semiconductor member 62 adjacent to the one of the multiple regions. For example, one of the multiple regions included in the second semiconductor member 62 contacts the first semiconductor member 61 adjacent to the one of the multiple regions.

For example, the fourth region 61d contacts the first region 62a, the second region 62b, and the third region 62c. For example, the sixth region 61f contacts the first region 62a. The fifth region 62e contacts the sixth region 61f. The seventh region 61g contacts the first region 62a, the fifth region 62e, and the third region 62c. The eighth region 61h contacts the second region 62b and the third region 62c.

As shown in FIG. 1C, for example, the multiple regions that are included in the second semiconductor member 62 are electrically connected to each other. For example, the first region 62a, the second region 62b, and the third region 62c are electrically connected to each other. The multiple regions that are included in the second semiconductor member 62 may be electrically connected to each other in a cross section that is different from the cross section shown in FIG. 1C.

Figure 5:
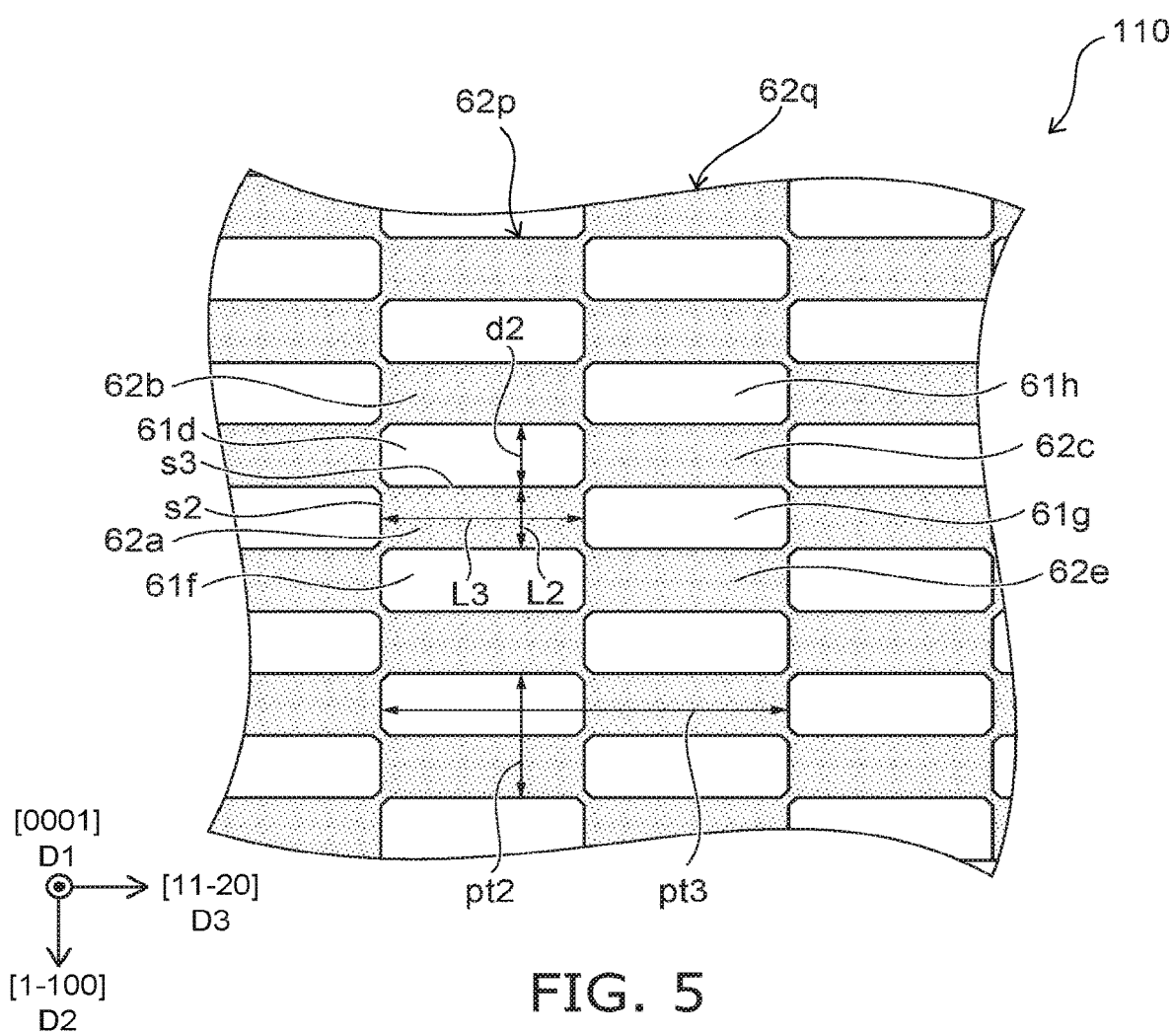
FIG. 5 is a schematic plan view illustrating the semiconductor device according to the first embodiment.

FIG. 5 is a schematic plan view illustrating the semiconductor device according to the first embodiment.

FIG. 5 is a plan view corresponding to FIG. 1C. In the example as shown in FIG. 5, the first region 62a includes a side s2 along the first and second directions D1 and D2 and a side s3 along the first and third directions D1 and D3. For example, these surfaces may correspond to at least a portion of the channel.

As shown in FIG. 5, the length along the second direction D2 of the first region 62a is taken as a length L2. The length along the third direction D3 of the first region 62a is taken as a length L3. The length L2 is less than the length L3. For example, the angle of one corner portion of the stacking fault 60S is about 60 degrees. For example, it is favorable for the length L3 to be not less than 1.7 times (not less than $(3)^{1/2}$ times) the length L2. The expansion of the stacking fault 60S can be effectively suppressed.

For example, a length d2 along the second direction D2 of the fourth region 61d is equal to the length along the second direction D2 of the third region 62c. For example, the length d2 is not less than 0.9 times and not more than 1.1 times the length along the second direction D2 of the third region 62c. For example, the length d2 along the second direction D2 of the fourth region 61d is less than the length L3 along the third direction D3 of the first region 62a.

For example, as shown in FIG. 5, the length along the second direction D2 of one of the multiple first-group regions 62p (corresponding to the length L2) is less than the length along the third direction D3 of one of the multiple first-group regions 62p (corresponding to the length L3).

For example, a pitch pt2 along the second direction D2 of the multiple regions included in the second semiconductor member 62 is less than a pitch pt3 along the third direction D3 of the multiple regions included in the second semiconductor member 62. By reducing the pitch pt2, for example, the expansion of the stacking fault 60S can be suppressed to be small.

For example, as shown in FIG. 5, the sum of the length along the second direction D2 of one of the multiple first-group regions 62p and the length along the second direction D2 of one of the multiple second-group regions 62q corresponds to the pitch pt2. The sum of the length along the third direction D3 of one of the multiple first-group regions 62p and the length along the third direction D3 of one of the multiple second-group regions 62q corresponds to the pitch pt3. For example, the pitch pt2 is less than the pitch pt3.

Figure 6:
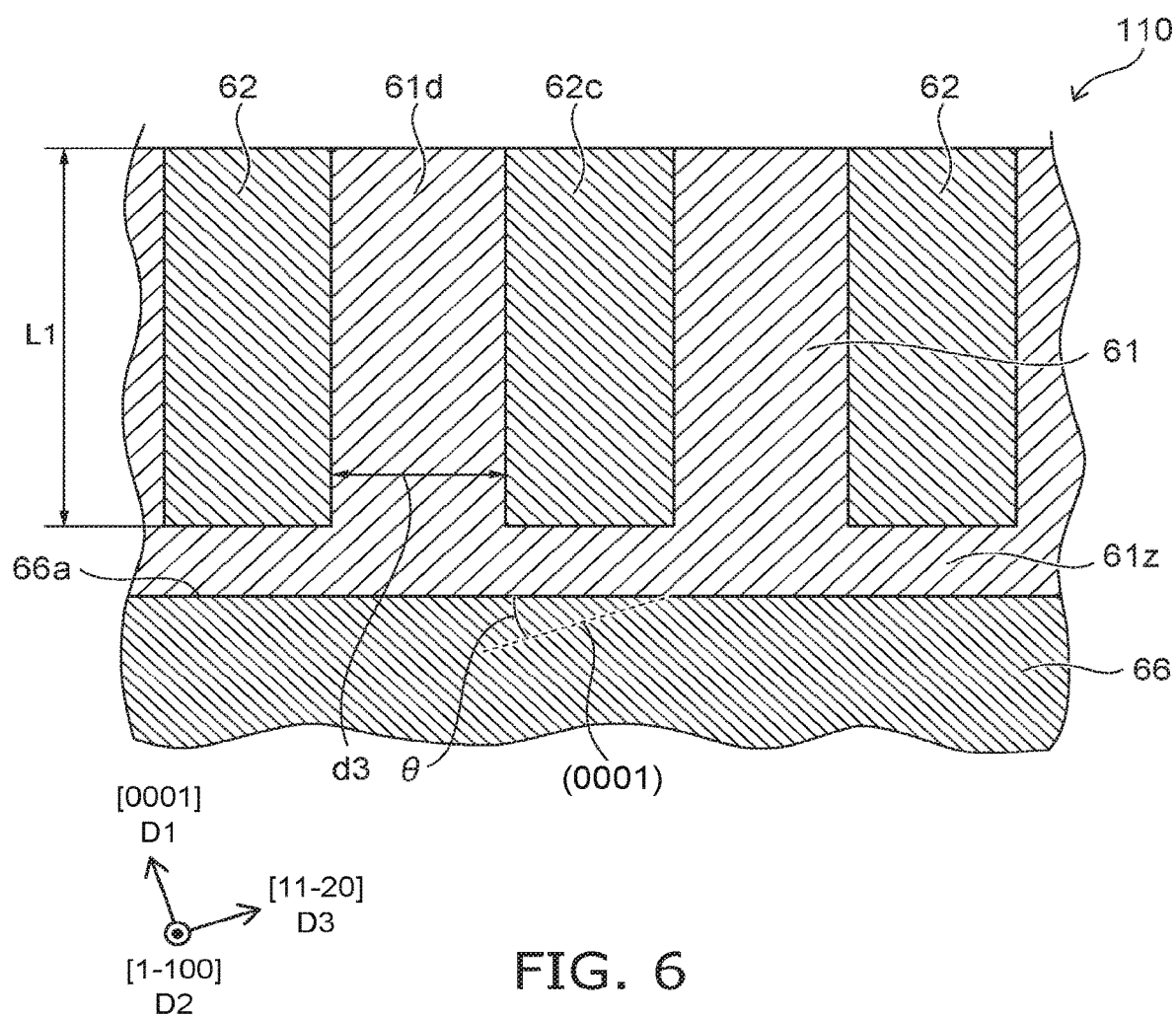
FIG. 6 is a schematic cross-sectional view illustrating the semiconductor device according to the first embodiment.

FIG. 6 is a schematic cross-sectional view illustrating the semiconductor device according to the first embodiment.

FIG. 6 is a cross-sectional view in the D1-D3 plane of the semiconductor device 110. As shown in FIG. 6, the base body 66 includes the surface 66a facing the first semiconductor member 61. The surface 66a faces the first semiconductor member 61. The [11-20] direction of the base body 66 may be oblique to the surface 66a. The angle between the surface 66a and the [11-20] direction of the base body 66 is taken as an angle θ. The angle θ is, for example, the off angle. The angle θ is, for example, greater than 0 degrees and not more than 10 degrees. The angle θ may be, for example, not less than 1 degree and not more than 5 degrees.

The length along the third direction D3 (i.e., the [11-20] direction) of the fourth region 61d is taken as a length d3. The length along the first direction D1 of one of the multiple regions included in the second semiconductor member 62 (e.g., the first region 62a) is taken as a length L1 (referring to FIGS. 1A and 6).

In the embodiment, it is favorable for the angle θ, the length d3, and the length L1 to satisfy the following first formula.

$$d3 < L1 \times (1/\tan \theta) \quad (1)$$

Thereby, the stacking fault 60S can be prevented from reaching the upper portion of the second semiconductor member 62 having the height of the length L1. For example, the Vf degradation can be suppressed thereby.

d3 may be, for example, not more than ½ of L1=(1/tan θ). The expansion of the stacking fault 60S can be suppressed more reliably.

The length L1 described above corresponds to the length along the first direction of one of the multiple first-group regions 62p. The length d3 corresponds to the length along the third direction D3 of the first partial region 61p. In the embodiment, it is favorable for the length (d3) along the third direction D3 of the first partial region 61p to be less than (1/tan θ) times the length (the length L1) along the first direction D1 of one of the multiple first-group regions 62p. In the embodiment, for example, the length L1 is greater than the length L2. For example, the length L1 is greater than the length L3.

Second Embodiment

Figure 7:
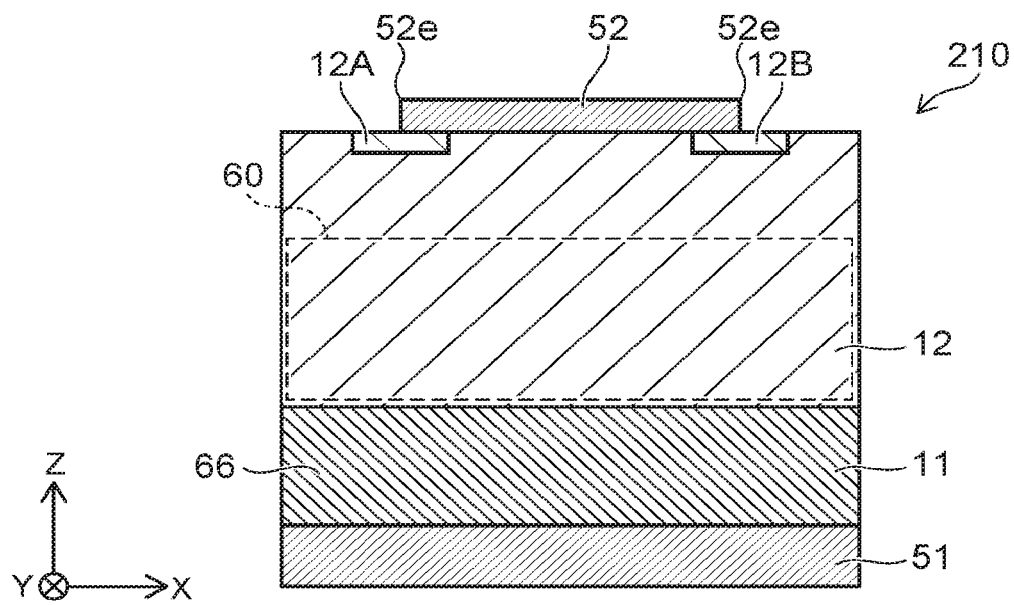
FIG. 7 is a schematic cross-sectional view illustrating a semiconductor device according to a second embodiment.

FIG. 7 is a schematic cross-sectional view illustrating a semiconductor device according to a second embodiment.

As shown in FIG. 7, the semiconductor device 210 according to the embodiment includes a first semiconductor region 11, a second semiconductor region 12, a first electrode 51, and a second electrode 52. The first semiconductor region 11 corresponds to the base body 66. At least a portion of the second semiconductor region 12 corresponds to a semiconductor layer 60. The semiconductor layer 60 includes the first semiconductor member 61 and the second semiconductor member 62 (referring to FIG. 1A, etc.).

The direction along the first direction D1 is taken as a Z-axis direction. One direction perpendicular to the Z-axis direction is taken as an X-axis direction. The direction perpendicular to the Z-axis direction and the X-axis direction is taken as a Y-axis direction. For example, the X-axis direction is along the [11-20] direction. For example, the Y-axis direction is along the [1-100] direction.

The base body 66 (the first semiconductor region 11) is between the first electrode 51 and the second electrode 52 in the first direction D1 (the Z-axis direction). At least a portion of the semiconductor layer 60 (the second semiconductor member 62) is between the base body 66 and the second electrode 52 in the first direction D1 (the Z-axis direction).

For example, the first semiconductor region 11 is of the first conductivity type (e.g., the n-type), and the second semiconductor region 12 is of the first conductivity type. For example, the impurity concentration of the first conductivity type in the first semiconductor region 11 is greater than the impurity concentration of the first conductivity type in the second semiconductor region 12. For example, the second electrode 52 has a Schottky junction with the second semiconductor region 12.

In the example, a junction terminal region 12A is provided between the second semiconductor region 12 and one end portion 52e of the second electrode 52. A junction terminal region 12B is provided between the second semiconductor region 12 and another end portion 52e of the second electrode 52.

The first electrode 51 is, for example, a cathode electrode. The second electrode 52 is, for example, an anode electrode.

For example, the first semiconductor region 11 corresponds to an n$^+$-region. For example, the second semiconductor region 12 corresponds to an n$^-$-region. For example, the second semiconductor region 12 corresponds to a drift layer.

In the embodiment, the semiconductor layer 60 that includes the first semiconductor member 61 and the second semiconductor member 62 is under at least the junction terminal region 12A and the junction terminal region 12B. For example, because the region in which the stacking fault 60S is suppressed is under the junction terminal region 12A and the junction terminal region 12B, the degradation of the breakdown voltage due to the stacking fault 60S can be suppressed.

Thus, the second electrode 52 includes the end portion 52e in a plane (e.g., substantially the X-Y plane) including the second direction D2 and the third direction D3. At least a portion of the first and second semiconductor members 61 and 62 is between the base body 66 and the end portion 52e described above in the first direction D1. For example, the degradation of the breakdown voltage can be suppressed.

Figure 8:
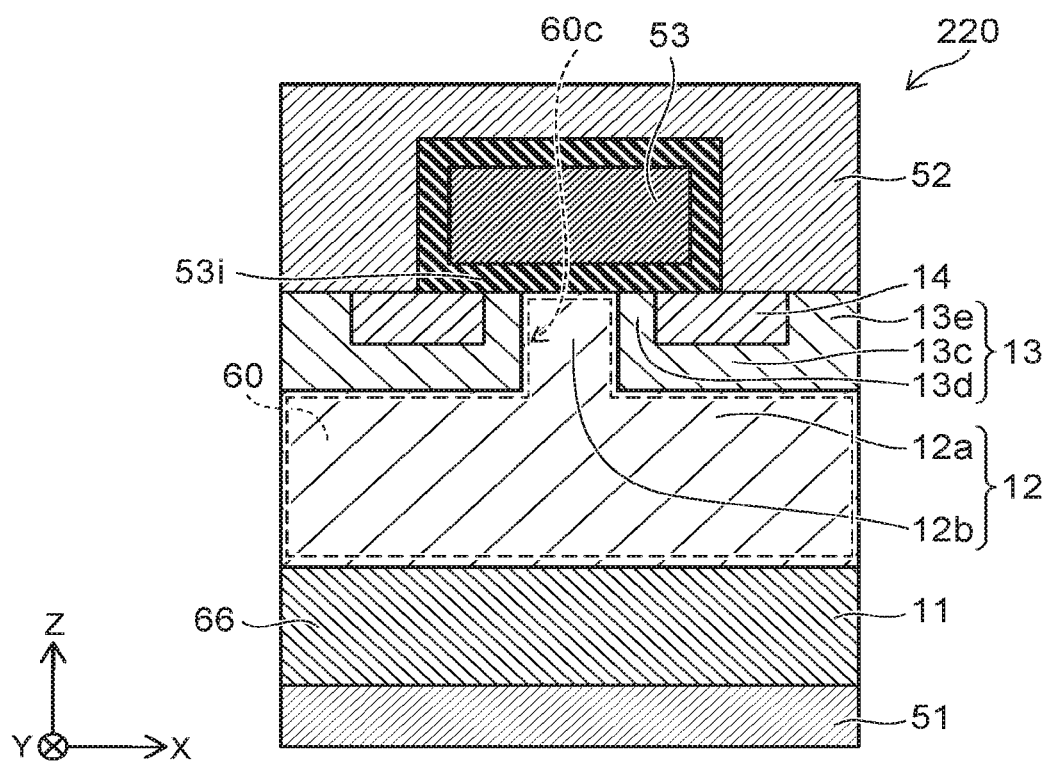
FIG. 8 is a schematic cross-sectional view illustrating a semiconductor device according to the second embodiment.

FIG. 8 is a schematic cross-sectional view illustrating a semiconductor device according to the second embodiment.

As shown in FIG. 8, the semiconductor device 220 according to the embodiment includes the first semiconductor region 11, the second semiconductor region 12, a third semiconductor region 13, a fourth semiconductor region 14, the first to third electrodes 51 to 53, and an insulating part 53i. For example, the first semiconductor region 11 corresponds to the base body 66. For example, at least a portion of the second semiconductor region 12 corresponds to the semiconductor layer 60.

The second semiconductor region 12 is of the first conductivity type. The third semiconductor region 13 is of the second conductivity type. The fourth semiconductor region 14 is of the first conductivity type. For example, the first conductivity type is the n-type, and the second conductivity type is the p-type.

The first semiconductor region 11 is between the first electrode 51 and at least a portion of the second electrode 52 and between the first electrode 51 and the third electrode 53 in the Z-axis direction. In the example, for example, the direction from the third electrode 53 toward the at least a portion of the second electrode 52 described above is along the X-axis direction.

The second semiconductor region 12 includes a first portion 12a and a second portion 12b. The first portion 12a is between the first semiconductor region 11 and the at least a portion of the second electrode 52 described above in the Z-axis direction. The second portion 12b is between the first semiconductor region 11 and the third electrode 53 in the Z-axis direction.

The third semiconductor region 13 includes a third portion 13c and a fourth portion 13d. The third portion 13c is between the first portion 12a and the at least a portion of the second electrode 52 described above in the Z-axis direction. In the example, the third semiconductor region 13 further includes a fifth portion 13e.

The fourth semiconductor region 14 is between the third portion 13c and the at least a portion of the second electrode 52 described above in the Z-axis direction. The fourth semiconductor region 14 is electrically connected to the second electrode 52.

For example, the fourth portion 13d of the third semiconductor region 13 is between the fourth semiconductor region 14 and at least a portion of the second portion 12b of the second semiconductor region 12 in the X-axis direction.

In the example, the fourth semiconductor region 14 is between the third portion 13c and the fifth portion 13e in the X-axis direction. The fifth portion 13e is electrically connected to the second electrode 52.

The insulating part 53i is between the second portion 12b and the third electrode 53 in the Z-axis direction. In the example, a portion of the insulating part 53i is provided also between the third electrode 53 and the fourth portion 13d and between the third electrode 53 and a portion of the fourth semiconductor region 14 in the Z-axis direction.

For example, the first electrode 51 corresponds to a drain electrode. For example, the second electrode 52 corresponds to a source electrode. For example, the third electrode 53 corresponds to a gate electrode. The first semiconductor region 11 is, for example, a SiC substrate. The first semiconductor region 11 is, for example, an n$^+$-region. For example, the second semiconductor region 12 corresponds to a drift layer. The second semiconductor region 12 is, for example, an n$^-$-region. For example, the third semiconductor region 13 corresponds to a p-well. For example, the fourth semiconductor region 14 corresponds to an n$^+$-source. The semiconductor device 220 is, for example, a MOSFET. The semiconductor device 210 is, for example, a vertical power MOSFET. The first semiconductor region 11 may be, for example, a p$^-$-region. In such a case, the semiconductor device 210 is, for example, an IGBT (Insulated Gate Bipolar Transistor).

As shown in FIG. 8, a current flows along a channel 60c in the semiconductor device 220. In the embodiment, for example, the channel 60c of the semiconductor layer 60 including the first semiconductor member 61 and the second semiconductor member 62 is along the (1-100) plane or the (0-33-8) plane of the base body 66. High mobility is easily obtained in the (1-100) plane or the (0-33-8) plane. For example, a low on-resistance is obtained.

Figure 9:
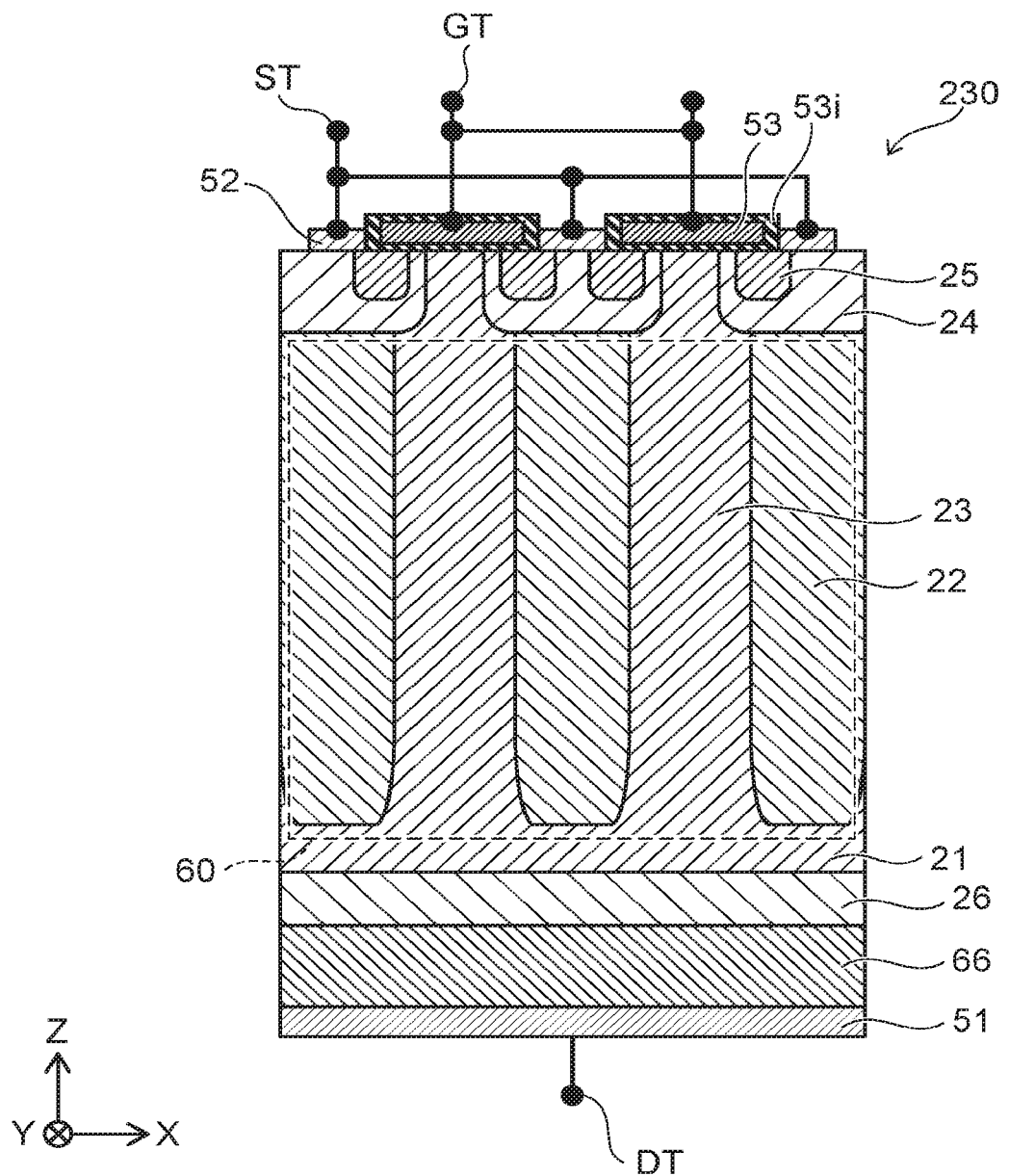
FIG. 9 is a schematic cross-sectional view illustrating a semiconductor device according to the second embodiment.

FIG. 9 is a schematic cross-sectional view illustrating a semiconductor device according to the second embodiment.

In the semiconductor device 230 according to the embodiment as shown in FIG. 9, the base body 66 is on the first electrode 51. An n$^+$-layer 26 is on the base body 66. An n-layer 21 is on the n$^+$-layer 26. The direction from the base body 66 toward the n$^+$-layer 26 is along the Z-axis direction. Multiple n-layers 23 and multiple p-layers 22 are provided on the n-layer 21. For example, the n-layers 23 and the p-layers 22 are alternately arranged along the X-axis direction. A p$^+$-layer 24 is provided on the p-layer 22. Multiple n$^+$-layers 25 are provided on a portion of the p$^+$-layer 24. A portion of the p$^+$-layer 24 is between one of the multiple n$^+$-layers 25 and another one of the multiple n$^+$-layers 25. The n-layers 23 correspond to at least a portion of the first semiconductor member 61. The p-layers 22 correspond to at least a portion of the second semiconductor member 62.

The insulating part 53i is provided on one of the multiple n$^+$-layers 25. One third electrode 53 is provided on the insulating part 53i. Another insulating part 53i is provided on another one of the multiple n$^+$-layers 25. Another one third electrode 53 is provided on the other insulating part 53i.

The second electrode 52 is provided on the portion of the p$^+$-layer 24 provided between the one of the multiple n$^+$-layers 25 and the other one of the multiple n$^+$-layers 25. The second electrode 52 is electrically connected to the p$^+$-layer 24.

A drain terminal DT is electrically connected to the first electrode 51. A source terminal ST is electrically connected to the second electrode 52. A gate terminal GT is electrically connected to the third electrode 53.

The semiconductor device 230 has a Si structure that includes the multiple n-layers 23 and the multiple p-layers 22. The n-layer 21, the multiple n-layers 23, and the multiple p-layers 22 correspond to the semiconductor layer 60.

The expansion of the stacking fault 60S can be suppressed in the semiconductor devices 210, 220, and 230.

According to the embodiments, a semiconductor device can be provided in which stable characteristics are obtained.

In the specification, "a state of being electrically connected" includes a state in which multiple conductors physically contact each other and a current flows between the multiple conductors. "A state of being electrically connected" includes a state in which another conductor is inserted between the multiple conductors and a current flows between the multiple conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, electrodes, insulating parts, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a base body including silicon carbide;
   a first semiconductor member including silicon carbide, the first semiconductor member being of a first conductivity type, the first semiconductor member having a structure including a [0001] direction, a [1-100] direction, and a [11-20] direction; and
   a second semiconductor member including silicon carbide, the second semiconductor member being of a second conductivity type, a first direction from the base body toward the first semiconductor member being along the [0001] direction,
the second semiconductor member including a first region, a second region, and a third region,
the first semiconductor member including a fourth region,
a second direction from the first region toward the second region being along the [1-100] direction,
the fourth region being between the first region and the second region in the second direction,
a third direction from the fourth region toward the third region being along the [1-100] direction,
a length along the third direction of the first region being not less than 1.7 times a length along the second direction of the first region.

2. The device according to claim 1, wherein
a length along the second direction of the fourth region is less than the length along the third direction of the first region.

3. The device according to claim 1, wherein
the base body includes a surface facing the first semiconductor member, and
an angle θ between the surface and the [11-20] direction, a length d3 along the third direction of the fourth region, and a length L1 along the first direction of the first region satisfy $d3 < L1 \times (1/\tan \theta)$.

4. The device according to claim 1, wherein
an end portion of the fourth region at the [11-20] direction side contacts an end portion of the third region at a [-1-120] direction side.

5. The device according to claim 1, wherein
the fourth region contacts the first, second, and third regions.

6. The device according to claim 1, wherein
the first region includes:
a side along the first and second directions; and
a side along the first and third directions.

7. The device according to claim 1, wherein
the first region, the second region, and the third region are electrically connected to each other.

8. The device according to claim 1, wherein
the first semiconductor member includes a first portion provided between the base body and the first region, between the base body and the second region, and between the base body and the third region.

9. The device according to claim 8, wherein
the first portion includes a stacking fault connected to a basal plane dislocation of the base body, and
at least a portion of the stacking fault contacts the second semiconductor member.

10. The device according to claim 8, wherein
the first portion includes a stacking fault connected to a basal plane dislocation of the base body, and
an expansion of the stacking fault stops at at least one of the first region, the second region, or the third region.

11. The device according to claim 1, wherein
the second semiconductor member further includes a fifth region,
the first semiconductor member further includes a sixth region, a seventh region, and an eighth region,
the fourth region is between the sixth region and the second region in the second direction,
the first region is between the sixth region and the fourth region in the second direction,
a direction from the sixth region toward the fifth region is along the third direction,
the third region is between the fifth region and the eighth region in the second direction,
the seventh region is between the fifth region and the third region in the second direction,
a direction from the first region toward the seventh region is along the third direction, and
a direction from the second region toward the eighth region is along the third direction.

12. The device according to claim 11, wherein
the sixth region contacts the first region,
the fifth region contacts the sixth region,
the seventh region contacts the first, fifth, and third regions, and
the eighth region contacts the second and third regions.

13. The device according to claim 1, wherein
the second semiconductor member includes:
a plurality of first-group regions arranged along the second direction; and
a plurality of second-group regions arranged along the second direction,
a pitch along the second direction of the plurality of first-group regions is equal to a pitch along the second direction of the plurality of second-group regions,
the first semiconductor member includes:
a first partial region between the plurality of first-group regions in the second direction; and
a second partial region between the plurality of second-group regions in the second direction,
a direction from the first partial region toward one of the plurality of second-group regions is along the third direction, and
a direction from one of the plurality of first-group regions toward the second partial region is along the third direction.

14. The device according to claim 13, wherein
a length along the second direction of the one of the plurality of first-group regions is less than a length along the third direction of the one of the plurality of first-group regions.

15. The device according to claim 14, wherein
a sum of the length along the second direction of the one of the plurality of first-group regions and a length along the second direction of the one of the plurality of second-group regions is less than a sum of the length along the third direction of the one of the plurality of first-group regions and a length along the third direction of the one of the plurality of second-group regions.

16. The device according to claim 13, wherein
the base body includes a surface facing the first semiconductor member,
θ is an angle between the surface and the [11-20] direction, and
a length along the third direction of the first partial region is less than 1/tan θ times a length along the first direction of the one of the plurality of first-group regions.

17. The device according to claim 1, wherein
a channel of a semiconductor layer including the first and second semiconductor members is along a (1-100) plane or a (0-33-8) plane of the base body.

18. The device according to claim 1, further comprising:
a first electrode; and
a second electrode,
the base body being between the first electrode and the second electrode in the first direction, at least a portion of the first and second semiconductor members being between the base body and the second electrode in the first direction.

19. The device according to claim 18, wherein the second electrode includes an end portion in a plane including the second and third directions, and the at least a portion of the first and second semiconductor members is between the base body and the end portion in the first direction.

* * * * *